United States Patent
Wang et al.

(10) Patent No.: US 12,451,408 B2
(45) Date of Patent: Oct. 21, 2025

(54) PACKAGE STRUCTURES

(71) Applicant: Taiwan Semiconductor Manufacturing Company, Ltd., Hsinchu (TW)

(72) Inventors: Pu Wang, Hsinchu (TW); Chin-Fu Kao, Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/772,247

(22) Filed: Jul. 14, 2024

(65) Prior Publication Data
US 2024/0371724 A1 Nov. 7, 2024

Related U.S. Application Data

(63) Continuation of application No. 17/665,608, filed on Feb. 7, 2022, now Pat. No. 12,068,218, which is a continuation of application No. 16/790,700, filed on Feb. 13, 2020, now Pat. No. 11,289,399.

(60) Provisional application No. 62/906,708, filed on Sep. 26, 2019.

(51) Int. Cl.
| | |
|---|---|
| *H01L 23/373* | (2006.01) |
| *H01L 21/50* | (2006.01) |
| *H01L 23/367* | (2006.01) |
| *H01L 25/065* | (2023.01) |
| *H01L 25/16* | (2023.01) |

(52) U.S. Cl.
CPC .......... *H01L 23/3735* (2013.01); *H01L 21/50* (2013.01); *H01L 23/367* (2013.01); *H01L 25/0657* (2013.01); *H01L 25/16* (2013.01); *H01L 2225/06589* (2013.01)

(58) Field of Classification Search
CPC ............. H01L 23/3735; H01L 25/0657; H01L 23/367
See application file for complete search history.

(56) References Cited

U.S. PATENT DOCUMENTS

| | | | | |
|---|---|---|---|---|
| 5,121,299 A | * | 6/1992 | Frankeny | H05K 3/4084 361/708 |
| 5,510,956 A | * | 4/1996 | Suzuki | H01L 23/3736 257/713 |
| 2007/0086168 A1 | * | 4/2007 | Khanna | H01L 23/42 257/E23.087 |

* cited by examiner

*Primary Examiner* — Dale E Page
*Assistant Examiner* — Wilner Jean Baptiste
(74) *Attorney, Agent, or Firm* — JCIPRNET

(57) ABSTRACT

A package structure includes a substrate, a first die, a second die, a first thermal conductive layer, a heat spreader and a second thermal conductive layer. The first die and the second die are bonded to the substrate. The first thermal conductive layer is inserted between the first die and the second die. The heat spreader is disposed on the substrate to cover the first die and the second die. The second thermal conductive layer is different from the first thermal conductive layer, wherein the second thermal conductive layer is disposed between the first thermal conductive layer and the heat spreader.

20 Claims, 17 Drawing Sheets

PACKAGE STRUCTURES

CROSS-REFERENCE TO RELATED APPLICATION

This application is a continuation application of and claims the priority benefit of a prior application Ser. No. 17/665,608, filed on Feb. 7, 2022 and now allowed. The prior application Ser. No. 17/665,608 is a continuation application of and claims the priority benefit of a prior application Ser. No. 16/790,700, filed on Feb. 13, 2020 and now allowed, and the priority benefit of U.S. provisional application Ser. No. 62/906,708, filed on Sep. 26, 2019. The entirety of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). Semiconductor devices and integrated circuits used in a variety of electronic apparatus are typically manufactured on a semiconductor wafer. The dies of the wafer may be processed and packaged with other semiconductor devices or dies, and various technologies have been developed for the packaging of integrated circuits. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (POP) devices and so on.

In the packaging of integrated circuits, a plurality of semiconductor dies may be stacked through bonding, and may be bonded to other package components such as package substrates. Heat dissipation is a challenge in the package structure of the integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
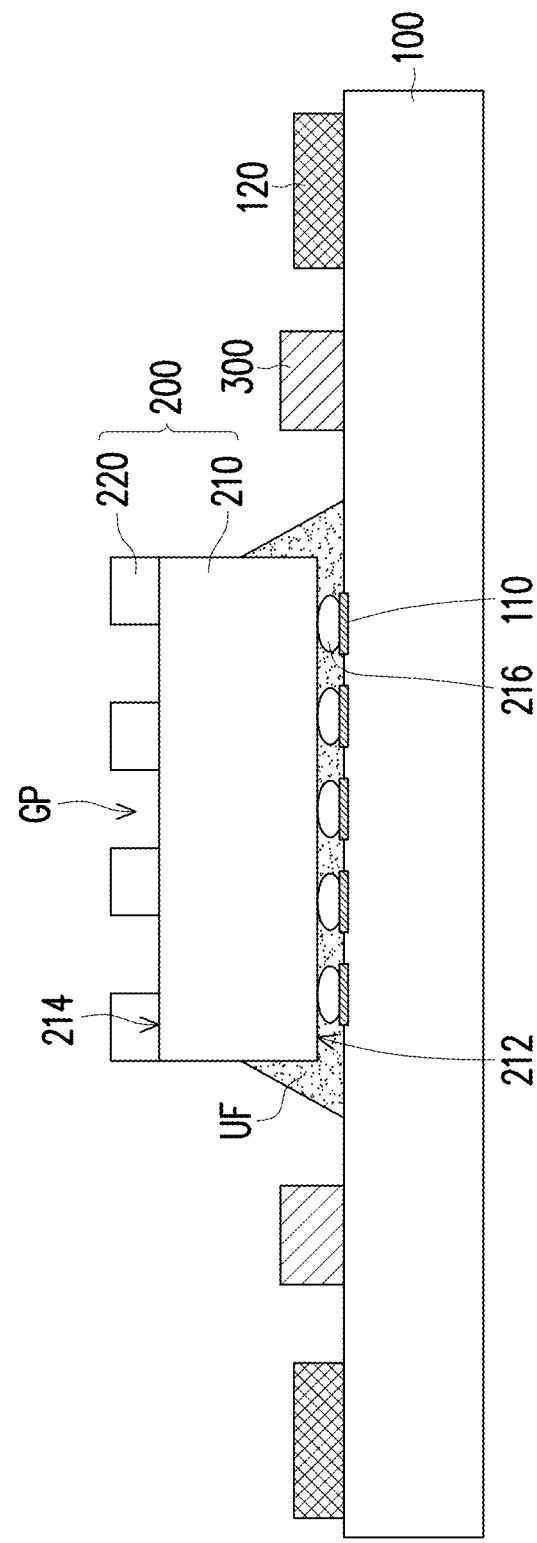
FIGS. 1A through 1D schematically illustrate cross-sectional views for manufacturing a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good first dies to increase the yield and decrease costs.

Figure 1B:
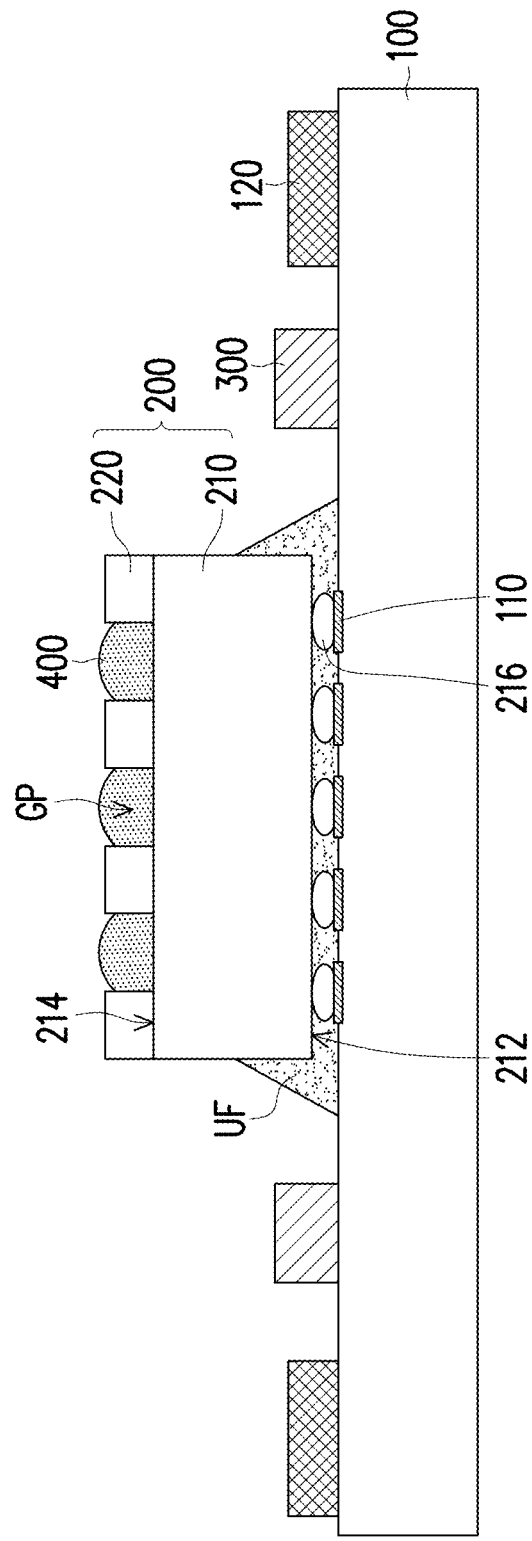
Figure 1C:
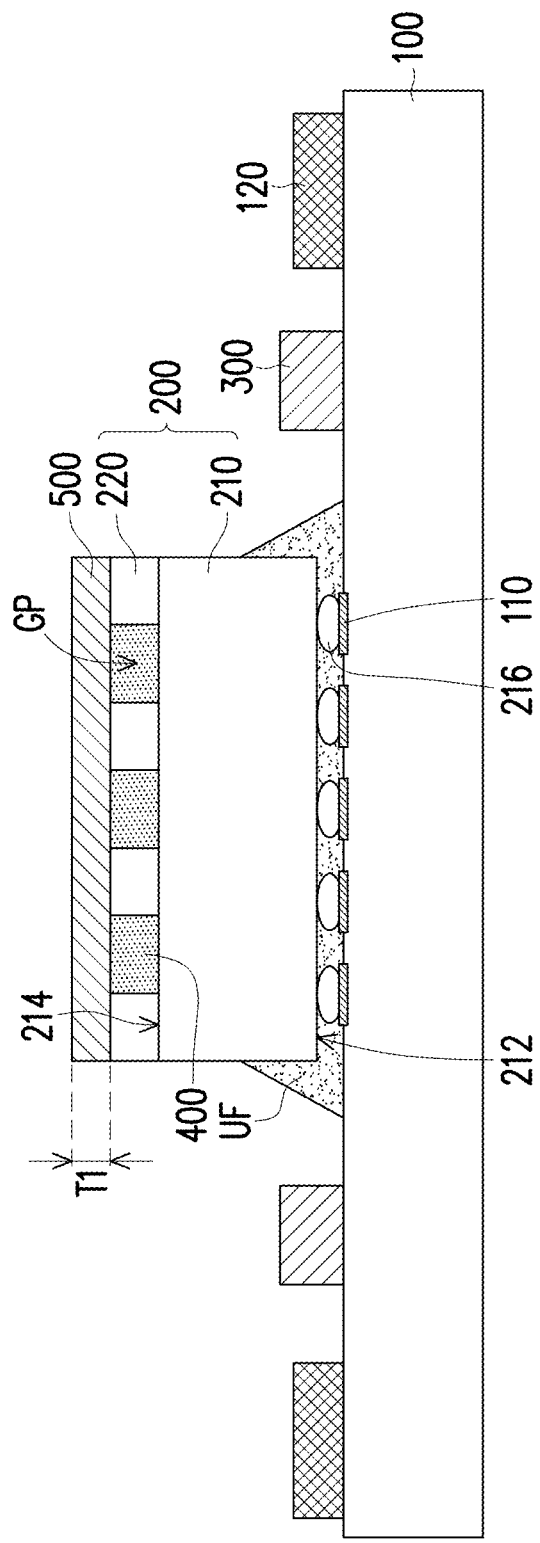
Figure 1D:
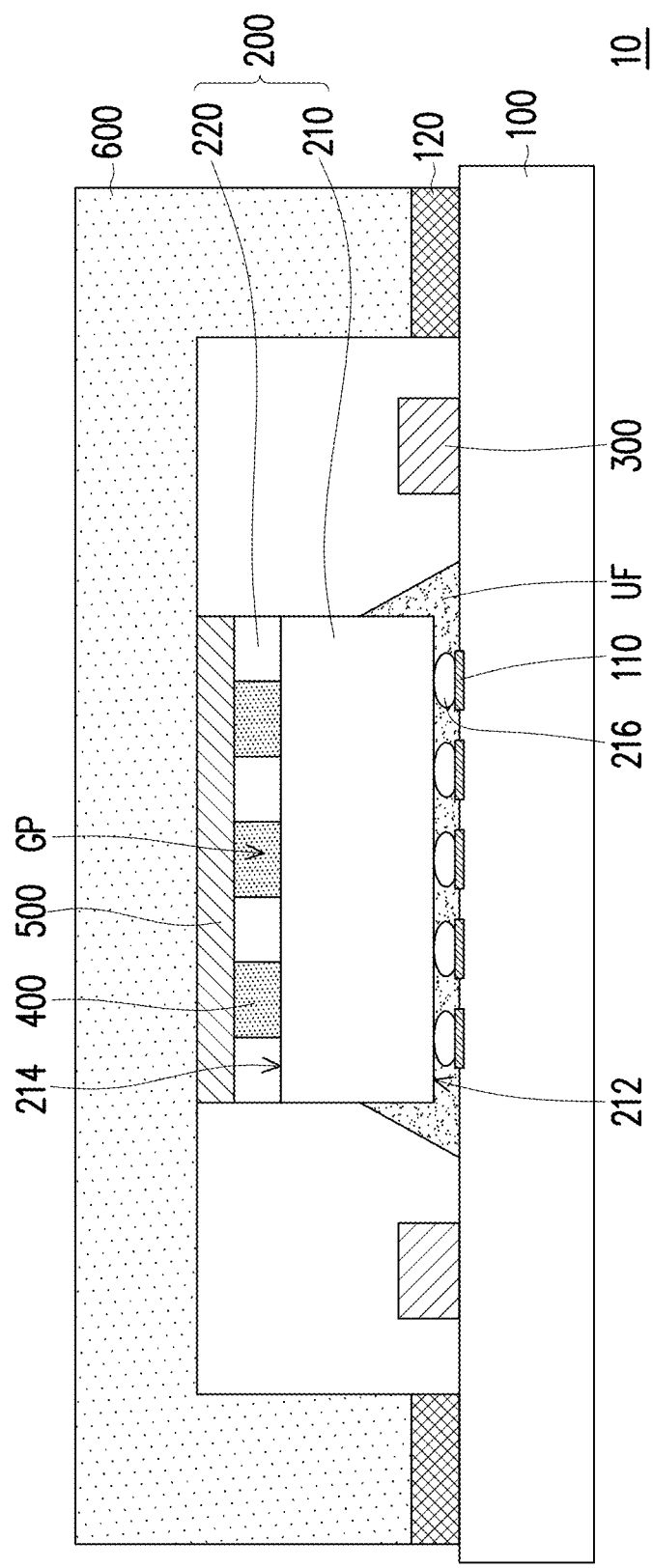
Figure 2:
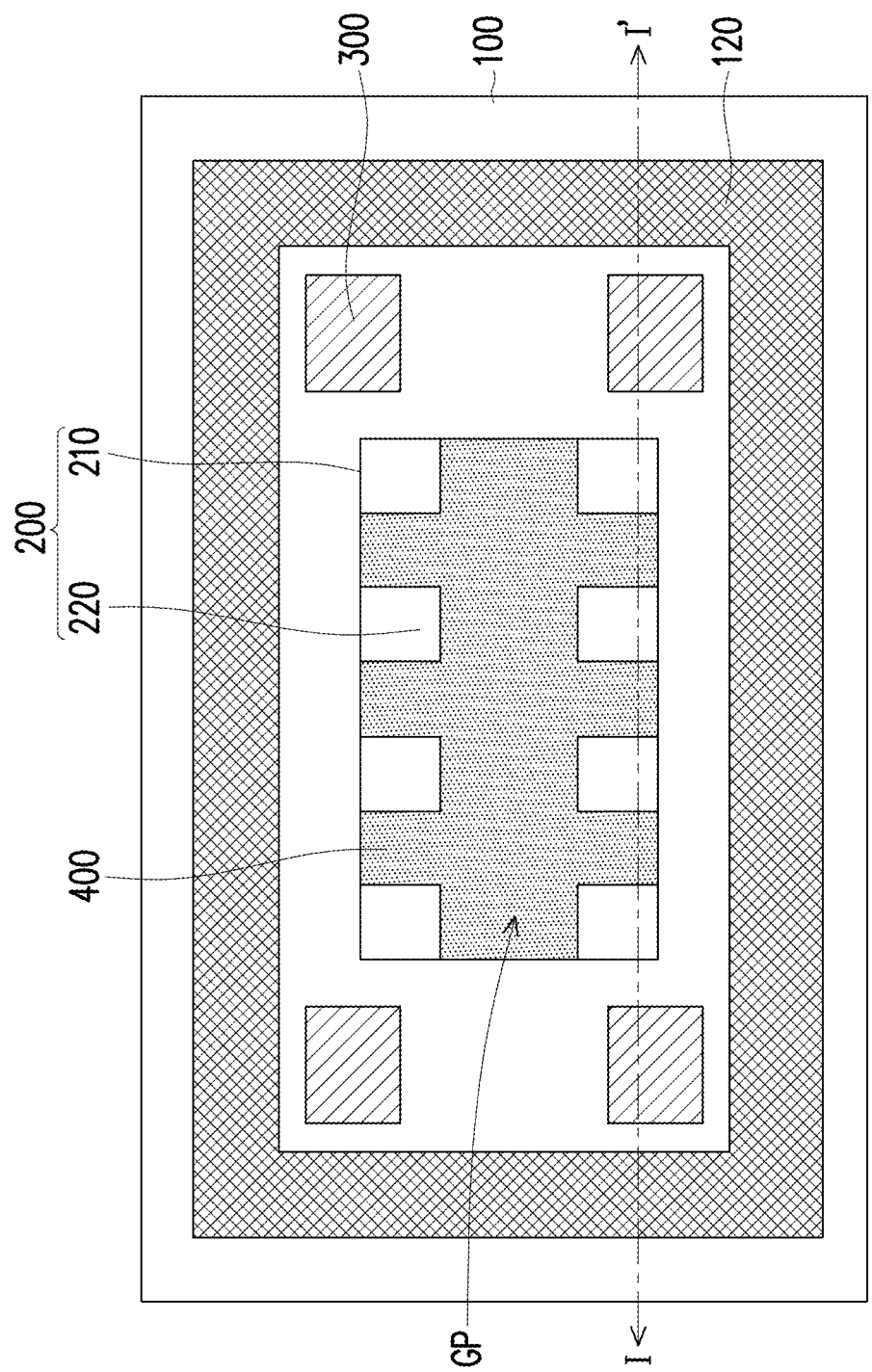
FIG. 2 is a schematic top view of the package structure in FIG. 1D.

FIGS. 1A through 1D schematically illustrate cross-sectional views for manufacturing a package structure in accordance with some embodiments of the disclosure. FIG. 2 is a schematic top view of the package structure in which some elements are omitted for clarity, wherein FIG. 1D is a schematic cross-sectional view along a line I-I' of FIG. 2.

Referring to FIG. 1A, a substrate 100 and a semiconductor package 200 bonded onto the substrate 100 are provided. In some embodiments, the substrate 100 is a circuit board such as a printed circuit board (PCB). The substrate 100 includes conductive pads 110 and circuits (not shown) thereon. The semiconductor package 200 includes an integrated circuit 210 and a plurality of components 220. The components 220 are disposed on the integrated circuit 210, and the integrated circuit 210 is disposed between the components 220 and the substrate 100.

The integrated circuit 210 includes a first surface 212 and a second surface 214 opposite to each other. The first surface 212 faces the substrate 100, in other words, the substrate 100 is underlying the first surface 212 of the integrated circuit 210. The integrated circuit 210 is electrically connected with the substrate 100. For example, the integrated circuit 210 has connectors 216 on the first surface 212, and the integrated circuit 210 is mounted to the substrate 100 by electrically connecting the connectors 216 of the integrated circuit 210 and the conductive pads 110 of the substrate 100. The connectors 216 may be solder balls, microbumps, or the like. The integrated circuit 210 may be bonded to the substrate 100 in a flip-chip manner. In some embodiments, after the integrated circuit 210 is bonded to the substrate 100, an underfill layer UF is formed between the integrated circuit 210 and the substrate 100 to protect the joints between the connectors 216 and the conductive pads 110. In some alternative embodiments, the underfill layer UF may be omitted. In other words, the integrated circuit 210 may be a bare die.

In some embodiments, the integrated circuit 210 is a die, a wafer or the like. The integrated circuit 210 may be made of a suitable elemental semiconductor, such as crystalline silicon, diamond, and germanium; a suitable compound semiconductor, such as gallium arsenide, silicon carbide, indium arsenide, and indium phosphide; or a suitable alloy semiconductor, such as silicon germanium carbide, gallium arsenic phosphide, and gallium indium phosphide. In some embodiments, the integrated circuit 210 may include active components (e.g., transistors or the like) and optionally passive components (e.g., resistors, capacitors, inductors or the like) formed therein. In some embodiment, the integrated circuit 210 may include through vias therein, and the through vias may be also referred as to through silicon vias (TSVs).

The components 220 are disposed on the second surface 214 of the integrated circuit 210. For example, as shown in FIG. 2, the components 220 are arranged in an array over the second surface 214 of the integrated circuit 210. In some embodiments, since the components 220 are separately disposed on the second surface 214 of the integrated circuit 210, gaps GP are formed between the components 220. In some embodiments, the gaps GP expose portions of the second surface 214 of the integrated circuit 210. Accordingly, a top surface of the semiconductor package 200 includes tops surfaces of the components 220 and the portions of the second surface 214 of the integrated circuit 210. Since the portions of the second surface 214 of the integrated circuit 210 are lower than the tops surfaces of the components 220, the semiconductor package 200 has an uneven top surface. In some alternative embodiments, the components 220 on the integrated circuit 210 have different heights, such that the semiconductor package 200 has the uneven top surface.

In some embodiments, the components 220 are dies or the like. The dies may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the dies may include active components (e.g., transistors or the like) and optionally passive components (e.g., resistors, capacitors, inductors or the like) formed therein.

In some embodiments, the components 220 may be mounted in a flip-chip manner onto the second surface 214 of the integrated circuit 210, but the disclosure is not limited thereto. In some alternative embodiments, the components 220 may be mounted by high temperature (e.g., an oxide-oxide bonding, a metal-metal bonding, or the like) or by an adhesive layer (e.g., a die attach film, a liquid-type film over wire, or the like) on the integrated circuit 210. In FIG. 1A, the connection structures (e.g., connectors, conductive pads, adhesive layers, or the like) between the components 220 and the integrated circuit 210 are omitted for the sake of clarity and convenience. In some embodiments, heights of the components 220 are substantially the same. However, the disclosure is not limited thereto. In some alternative embodiments, the heights of the components 220 are different from each other.

In some embodiments, passive devices 300 are formed on the substrate 100 aside the components 220. The passive devices 300 are electrically connected with the substrate 100. The passive devices 300 may be integrated passive die (IPD), integrated voltage regulator (IVR) or the like. The passive devices 300 may include resistors, capacitors, inductors or the like. In FIG. 1A, the connect structures (e.g., connectors, conductive pads, adhesive layers, or the like) between the passive devices 300 and the substrate 100 are omitted for the sake of clarity and convenience. However, in some alternative embodiments, the passive devices 300 are omitted.

In some embodiments, an adhesive layer 120 is formed on the substrate 100. The adhesive layer 120 is formed for adhering of a heat spreader onto the substrate 100. In some embodiments, the adhesive layer 120 may be ring-shaped, to surround the integrated circuit 210 and the passive devices 300. However, the disclosure is not limited thereto. In other embodiments, the adhesive layer 120 may include a plurality of non-linear lines with gaps therebetween. The adhesive layer 120 may be pre-formed on the heat spreader or the adhesive layer 120 may be formed at any stage of the manufacturing the package structure before adhering the heat spreader onto the substrate 100.

Referring to FIG. 1B, a thermal conductive gel 400 is formed over the second surface 214 of the integrated circuit 210, to fill the gaps GP between the components 220. In some embodiments, as shown in FIG. 2, an outermost sidewall of the thermal conductive gel 400 is substantially flush with the edge of the integrated circuit 210. However, the disclosure is not limited thereto. For example, in some alternative embodiments, a gap is formed between the thermal conductive gel 400 and the edge of the integrated circuit 210. The thermal conductive gel 400 has fluidity, and thus the thermal conductive gel 400 may fill up the gaps GP between the components 220. The thermal conductive gel 400 may be electrically conductive materials or electrically insulative materials. The thermal conductive gel 400 includes a polymeric material (e.g., silicone and silica gel), solder paste (e.g., indium solder paste), or the like. The method of forming the thermal conductive gel 400 includes, for example, printing, dispensing, or the like. In some embodiments, the thermal conductive gel 400 between the adjacent components 220 may have a convex top surface. In other words, the top surface of the thermal conductive gel 400 may be not flush with the top surfaces of the components 220. However, the disclosure is not limited thereto. In some alternative embodiments, the top surface of the thermal conductive gel 400 may be substantially coplanar with or slightly lower than the top surfaces of the components 220.

Referring to FIG. 1C, a thermal conductive film 500 is formed over the components 220 and the thermal conductive gel 400. In some embodiments, a sidewall of the thermal conductive film 500 is aligned with a sidewall of the semiconductor package 200 (i.e., sidewalls of the components 220). The thermal conductive film 500 includes graphite or metal such as tin, silver, copper, indium, a combination thereof, an alloy thereof or the like. A thermal conductivity of the thermal conductive film 500 is higher than a thermal conductivity of the thermal conductive gel 400. The thermal conductivity of the thermal conductive film 500 is 5 W/(m·K)~100 W/(m·K) (e.g. 20 W/(m·K)~100 W/(m·K)), and the thermal conductivity of the thermal conductive gel 400 is 2 W/(m·K)~30 W/(m·K) (e.g. 2 W/(m·K)~20 W/(m·K)). In some embodiment, the thermal conductivity of the thermal conductive gel 400 is 2~10 W/(m·K) and the thermal conductive gel 400 has improved reliability. The thickness T1 of the thermal conductive film 500 may range from 50 μm to 300 μm. For example, the thickness T1 of the thermal conductive film 500 is about 100 μm. However, the disclosure is not limited thereto.

The method of forming the thermal conductive film 500 includes placing the thermal conductive film 500 over the components 220 and pressing the thermal conductive film 500 onto the components 220 and the thermal conductive gel 400. The above steps may be performed by an indenter, a roller or the like. In some embodiments, after forming the thermal conductive film 500, a heating process may be performed on the thermal conductive gel 400, to increase the fluidity of the thermal conductive gel 400. The heating step may be also performed by an indenter, a roller or the like. In some embodiments, as shown in FIG. 1C, a top surface of the thermal conductive gel 400 is substantially coplanar with top surfaces of the components 220.

Referring to FIG. 1D, a heat spreader 600 is disposed over the thermal conductive film 500. In some embodiments, the heat spreader 600 is disposed over the substrate 100 to cover the semiconductor package 200, the thermal conductive gel 400 and the thermal conductive film 500. For example, the heat spreader 600 covers and surrounds the semiconductor package 200, the thermal conductive gel 400 and the thermal conductive film 500. In some embodiments, the heat spreader 600 is in direct contact with the thermal conductive film 500. The heat spreader 600 may be a lid as shown in FIG. 1D, a water cooling device, or a heatsink device. In some embodiments, the heat spreader 600 is attached to the substrate 100 though the adhesive layer 120. The heat spreader 600 may be formed from a material with high thermal conductivity, such as steel, stainless steel, copper, the like, or combinations thereof. In addition, the heat spreader 600 may be additionally coated with another metal such as gold. In some embodiments, the heat spreader 600 is integrally formed. However, in some alternative embodiments, the heat spreader 600 are formed by a plurality of separated pieces.

In some embodiments, by forming the thermal conductive gel 400 between the components 220 of the semiconductor package 200 and the thermal conductive film 500 thereover, the heat spreader 600 may be thermally coupled with the semiconductor device 200 having uneven top surface efficiently. Thus, heat is prevented from being trapped between the auxiliary components 220, thereby decreasing the operating temperature of the integrated circuit 210 and the components 220 (e.g., dies) and improving the reliability and electrical performance of the semiconductor package 200.

After the heat spreader 600 is formed, a package structure 10 of the application is thus completed. In some embodiments, the integrated circuit 210 may be a wafer and the components 220 may be dies, and thus the semiconductor package 200 may be referred to as a "CoW (Chip on Wafer) package." Accordingly, the package structure 10 including the substrate 100 and the integrated circuit 210 thereon may be referred as a "CoWoS (Chip on Wafer on Substrate) package." However, the disclosure is not limited thereto. In some alternative embodiments, the semiconductor package 200 may be other type of packages, such as system on integrated chip (SoIC), integrated fan-out (InFO) package or the like.

Figure 3:
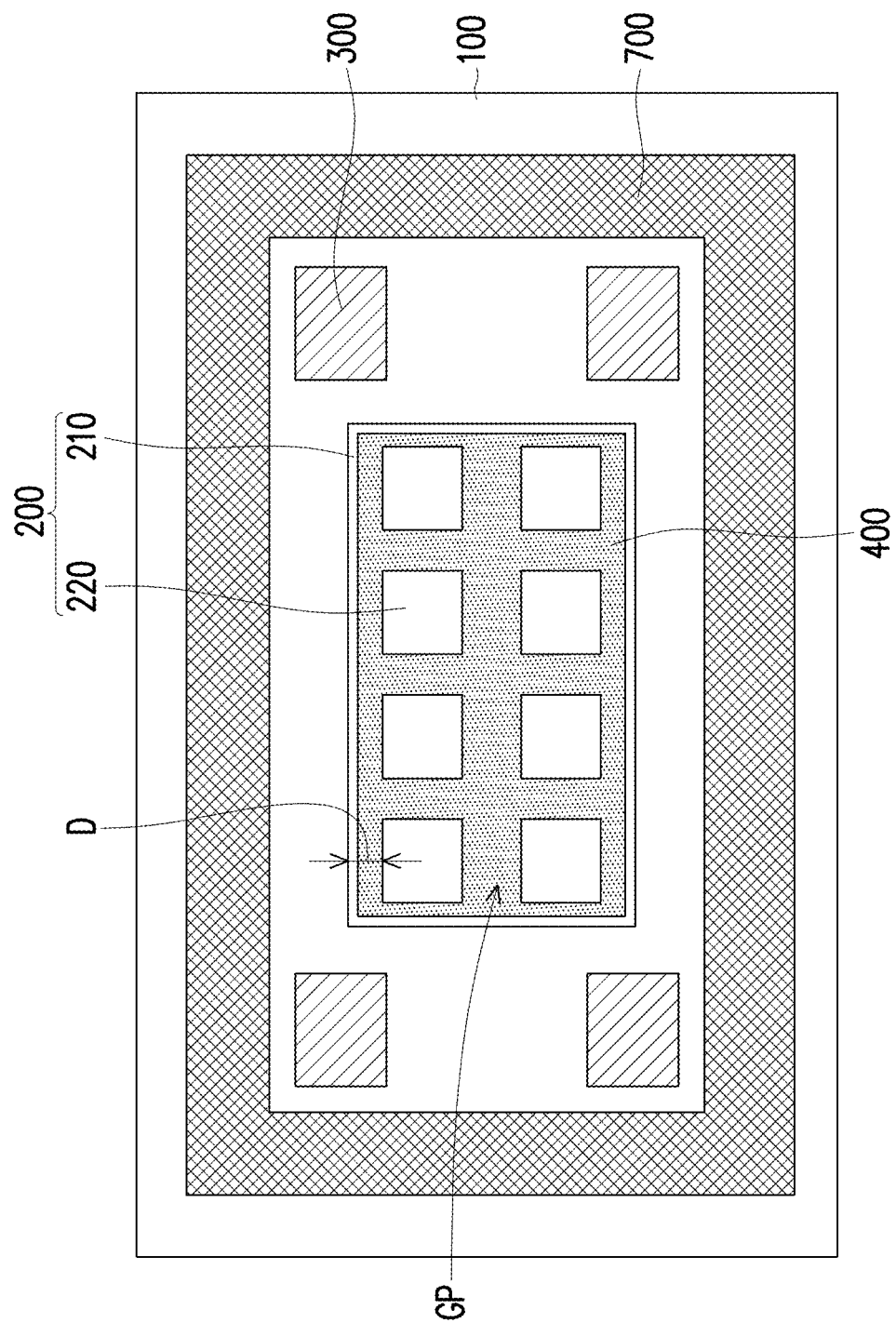
FIG. 3 schematically illustrates a top view of a package structure in accordance with some embodiments of the disclosure.

In some embodiments, the components 220 are illustrated as disposed at the edge of the integrated circuit 210. However, the arrangement of the components 220 may be adjusted according to an actual requirement. For example, in some embodiments, as shown in FIG. 3, the components 220 are distanced from the edge of the integrated circuit 210, that is, a distance D is formed between the components 220 and the edge of the integrated circuit 210. In some embodiments, the thermal conductive gel 400 fills the gaps GP between the components 220 and surrounds the components 220 of the semiconductor package 200. That is, the thermal conductive gel 400 is further disposed between the edge of the integrated circuit 210 and the components 220. In some embodiments, the thermal conductive gel 400 is distanced from the edge of the integrated circuit 210. However, the disclosure is not limited thereto. In some alternative embodiments, a portion of the thermal conductive gel 400 is at the edge of the integrated circuit 210.

Figure 4A:
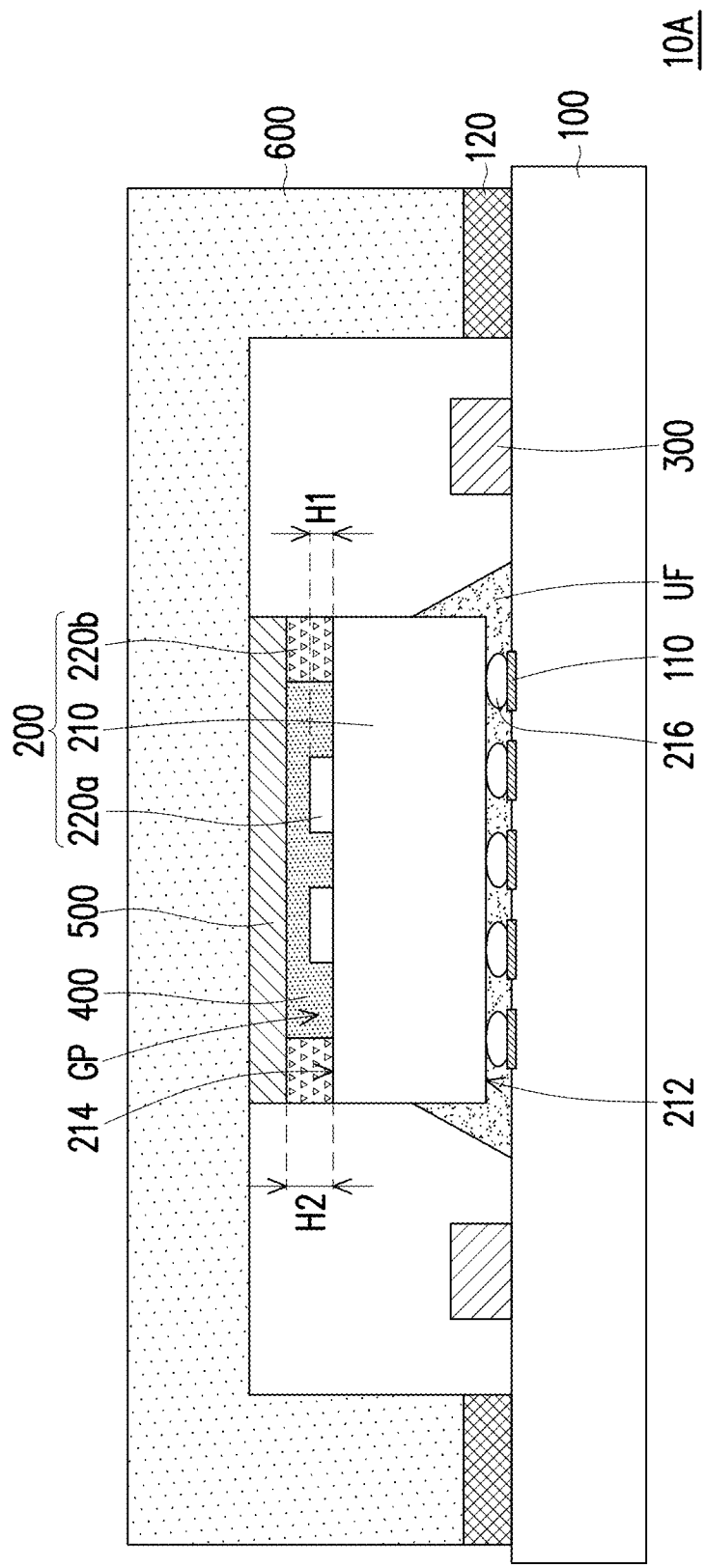
FIG. 4A schematically illustrates a cross-sectional view of a package structure in accordance with some embodiments of the disclosure.
Figure 4B:
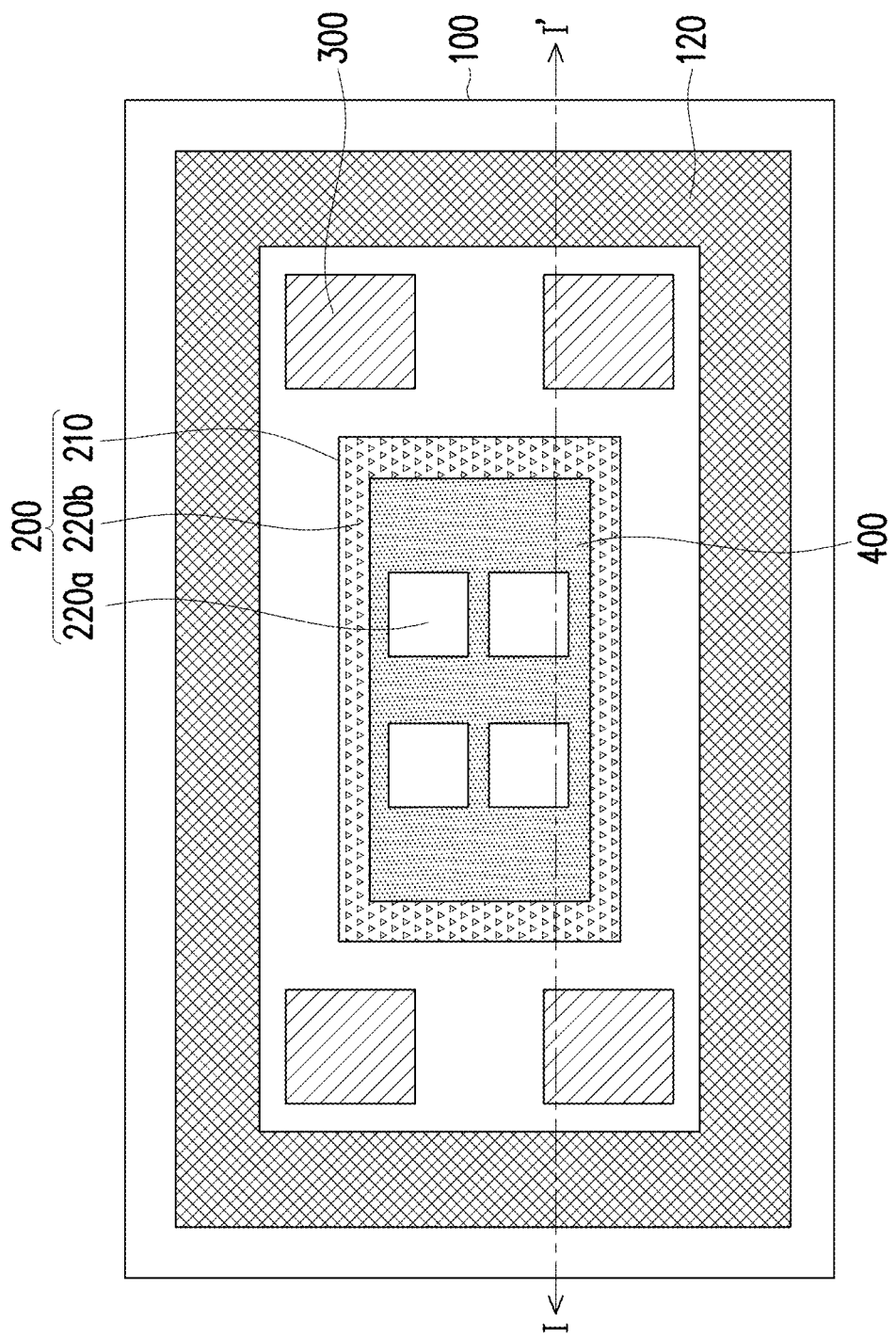
FIG. 4B is a schematic top view of the package structure in FIG. 3A.

FIGS. 4A and 4B schematically illustrate a cross-sectional view and a top view of a package structure in accordance with some embodiments of the disclosure, wherein FIG. 4A is a schematic cross-sectional view along a line I-I' of FIG. 4B. The package structure 10A of FIGS. 4A and 4B is similar to the package structure 10 of FIGS. 1D and 2, hence the same reference numerals are used to refer to the same and liked parts, and its detailed description will be omitted herein. The main difference is described as follows.

Referring to FIG. 4A and FIG. 4B, components 220a, 220b are disposed on the second surface 214 of the integrated circuit 210. In some embodiments, the components 220a may be dies, and the component 220b may be a dam. The component 220b may have a rectangular-ring shape and surrounds the components 220a, for example. A height H2 of the second component 220b may be larger or substantially the same as a height H1 of the first components 220a.

The thermal conductive gel 400 fills the gaps GP between the components 220a, 220b, that is, the thermal conductive gel 400 is disposed between the components 220a and between the components 220a and the component 220b. For example, the thermal conductive gel 400 is disposed between the dies and between the dies and the dam and covers the dies. In some embodiments, a top surface of the thermal conductive gel 400 may be substantially coplanar with the top surface of the component 220b, and top surfaces of the components 220a are covered by the thermal conductive gel 400. In other words, since top surfaces of the components 220a are lowered than a top surface of the component 220b, the components 220a are embedded in the thermal conductive gel 400. In some embodiments, the thermal conductive film 500 is in contact with the thermal conductive gel 400 and the component 220b. However, the disclosure is not limited thereto. In some alternative embodiments, the height H1 of the components 220a may be substantially the same as the height H2 of the component 220b, and the top surfaces of the components 220a, 220b are both substantially coplanar with the top surface of the thermal conductive gel 400 without being covered by the thermal conductive gel 400. In addition, in some alternative embodiments, the components 220a may also have different heights from each other. In some embodiments, by forming the component 220b surrounding the components 220a as a barrier, the thermal conductive gel 400 may be formed between the components 220a, 220b without overflowing out of the top surface of the integrated circuit 210, and thus the performance of the package structure 10A is improved.

Figure 5:
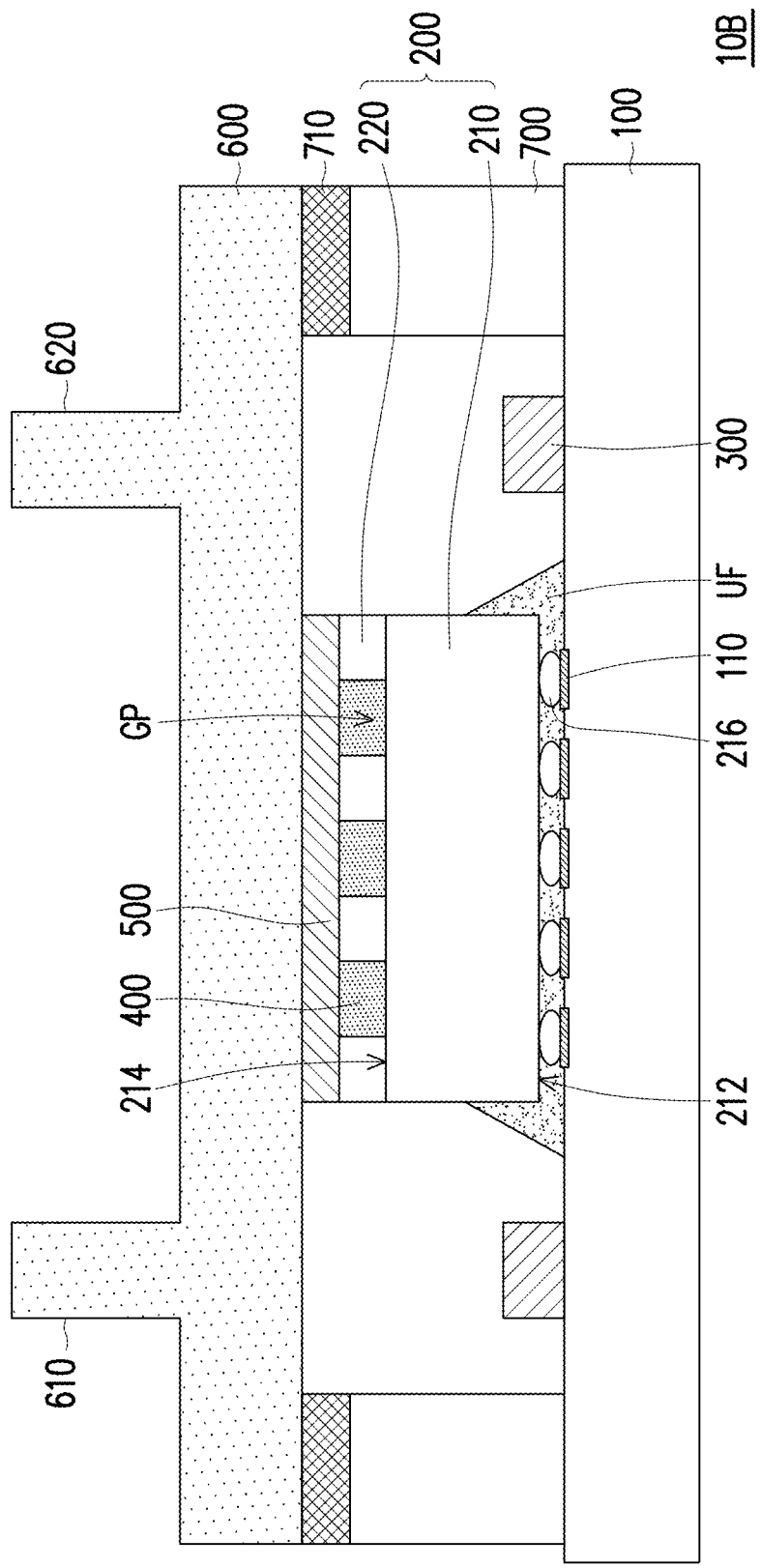
FIG. 5 schematically illustrates a cross-sectional view of a package structure in accordance with some embodiments of the disclosure.

FIG. 5 schematically illustrate a cross-sectional view of a package structure in accordance with some embodiments of the disclosure. The package structure 10B of FIG. 5 is similar to the package structure 10 of FIG. 1D, hence the same reference numerals are used to refer to the same and liked parts, and its detailed description will be omitted herein. The main difference is described as follows.

Referring to FIG. 5, the heat spreader 600 of the package structure 10B is a water cooling device and includes an inlet 610 and an outlet 620. Water enters the heat spreader 600 from the inlet 610 and exits the heat spreader 600 from the outlet 620. In some embodiments, a support structure 700 is provided to sustain the heat spreader 600. The support structure 700 may be rectangular-ring shape, for example. The heat spreader 600 may be adhered to the support structure 700 through an adhesive layer 710 therebetween. The support structure 700 provides mechanical reinforcement for the package structure 10B, and thus the warpage of the package structure 10B may prevented.

Figure 6:
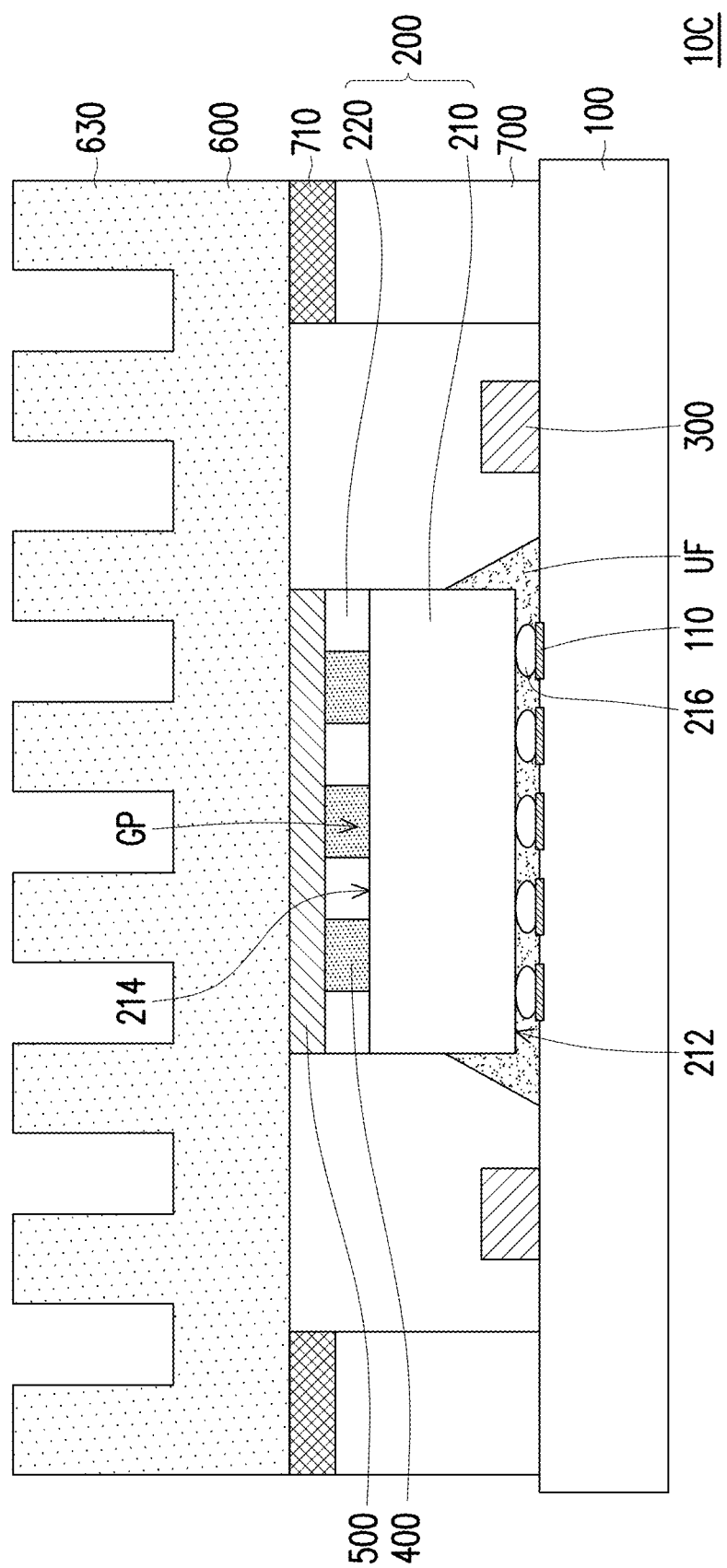
FIG. 6 schematically illustrates a cross-sectional view of a package structure in accordance with some embodiments of the disclosure.

FIG. 6 schematically illustrate a cross-sectional view of a package structure in accordance with some embodiments of the disclosure. The package structure 10C of FIG. 6 is similar to the package structure 10B of FIG. 5, hence the same reference numerals are used to refer to the same and liked parts, and its detailed description will be omitted herein. The main difference lies in that the heat spreader 600 of the package structure 10C is a heatsink device and includes fins 630.

Figure 7A:
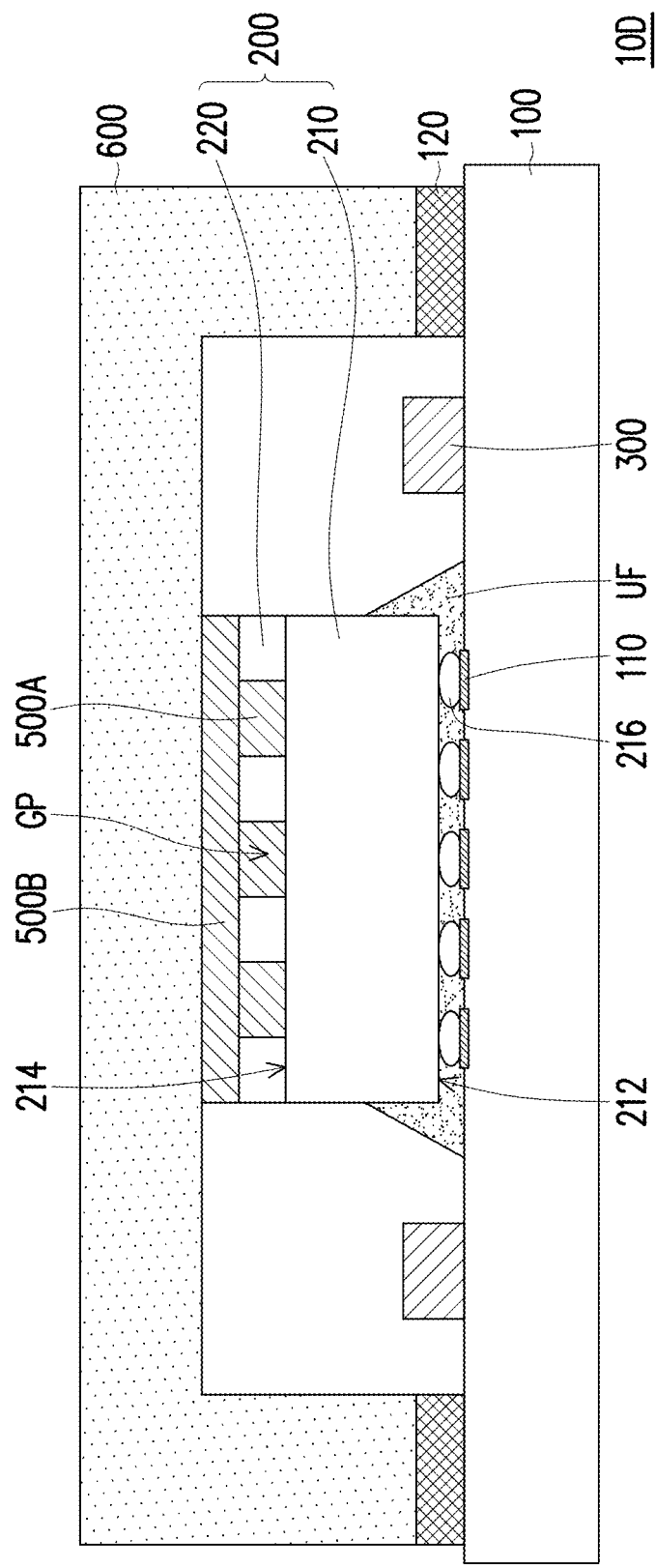
FIG. 7A schematically illustrates a cross-sectional view of a package structure in accordance with some embodiments of the disclosure.
Figure 7B:
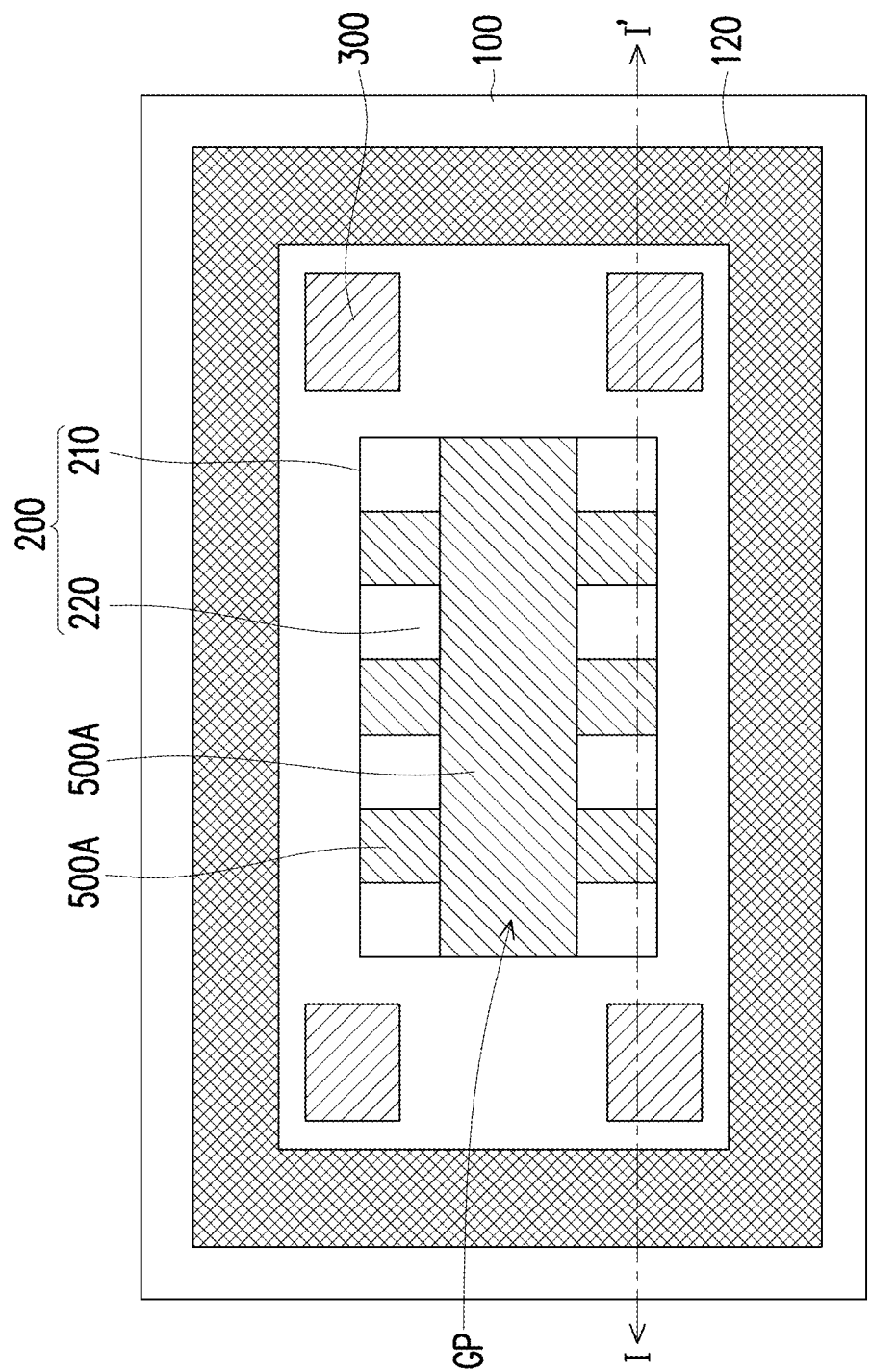
FIG. 7B is a schematic top view of the package structure in FIG. 6A.

FIGS. 7A and 7B schematically illustrate a cross-sectional view and a top view of a package structure in accordance with some embodiments of the disclosure, and FIG. 7A is a schematic cross-sectional view along a line I-I' of FIG. 7B. The package structure 10D of FIGS. 7A and 7B is similar to the package structure 10 of FIGS. 1D and 2, hence the same reference numerals are used to refer to the same and liked parts, and its detailed description will be omitted herein. The main difference lies in that thermal conductive gel is replaced with thermal conductive film.

Referring to FIGS. 7A and 7B, the package structure 10D includes the substrate 100, the semiconductor package 200, a plurality of first thermal conductive films 500A, a second thermal conductive film 500B and the heat spreader 600. In some embodiments, the first thermal conductive films 500A are disposed between the components 220 over the second surface 214 of the integrated circuit 210. Top surfaces of the first thermal conductive films 500A are substantially coplanar with top surfaces of the components 220. The second thermal conductive film 500B is disposed on the components 220 and the first thermal conductive films 500A. A total area (vertical projection area on the substrate 100) of the first thermal conductive films 500A is smaller than an area (vertical projection area on the substrate 100) of the second thermal conductive film 500B.

In some embodiments, before placing in the gaps between the components 220 of the semiconductor package 200, the first thermal conductive films 500A are respectively pre-formed with a fixed shaped. Similarly, before placing onto the semiconductor package 200 and the first thermal conductive films 500A, the second thermal conductive film 500B is pre-formed. The first thermal conductive films 500A and the second thermal conductive film 500B may be sheets or films with high thermal conductivity such as sheets of tin, silver, copper, or indium, or a combination of the above, or an alloy of the above. As shown in FIG. 7B, the first thermal conductive films 500A may have a rectangular shape respectively, and the first thermal conductive films 500A are spliced to fill the gaps between the components 220.

Figure 8:
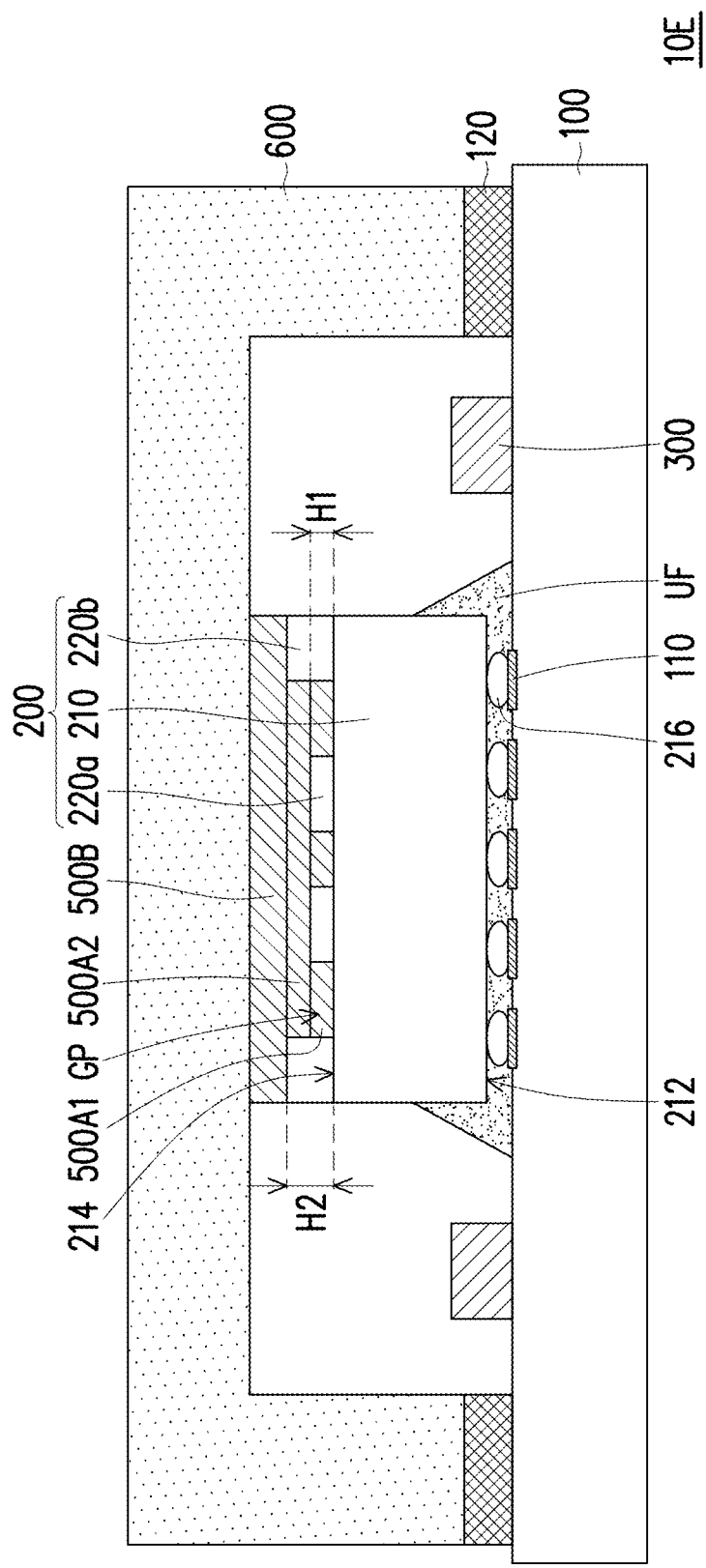
FIG. 8 schematically illustrates a cross-sectional view of a package structure in accordance with some embodiments of the disclosure.

FIG. 8 schematically illustrates a cross-sectional view of a package structure in accordance with some embodiments of the disclosure. The package structure 10E of FIG. 8 is similar to the package structure 10D of FIG. 7A, hence the same reference numerals are used to refer to the same and liked parts, and its detailed description will be omitted herein. The main difference lies in that thermal conductive gel is replaced with thermal conductive film.

Referring to FIG. 8, the package structure 10E includes the substrate 100, the semiconductor package 200 including components 220a, 220b thereon, a plurality of first thermal conductive films 500A1, 500A2, a second thermal conductive film 500B and the heat spreader 600. The components 220a, 220b have different heights H1, H2. In some embodiments, the components 220a, 220b are dies.

In some embodiments, the height H2 of the component 220b is higher than the height H1 of the components 220a. The first thermal conductive films 500A1 and the first thermal conductive film 500A2 are located between the components 220a, 220b. For example, the first thermal conductive films 500A1 are disposed between the components 220a and between the components 220a and the components 220b, and tops surfaces of the first thermal conductive films 500A1 are substantially coplanar with top surface of the components 220a. The first thermal conductive film 500A2 is disposed between the components 220b over the top surface of the components 220a and the first thermal conductive films 500A1. In other words, the top surface of the second component 220a and the top surfaces of the first thermal conductive films 500A1 are covered by the first thermal conductive films 500A2. In some embodiments, the second thermal conductive film 500B is in contact with the first thermal conductive films 500A2 and the first components 220b.

In some embodiments, by filling the thermal conductive gel (or the first thermal conductive film) between the components of the semiconductor package, a levelling surface is created. In addition, the thermal conductive film (or the second thermal conductive film) with high thermal conductivity is formed over the thermal conductive gel (or the first thermal conductive film) and the semiconductor package. The heat spreader is further disposed over the semiconductor package and thermally coupled to the semiconductor package through the thermal conductive film (or the second thermal conductive film) and the thermal conductive gel (or the first thermal conductive film). Accordingly, the heat dissipation of the semiconductor package may be improved.

Figure 9:
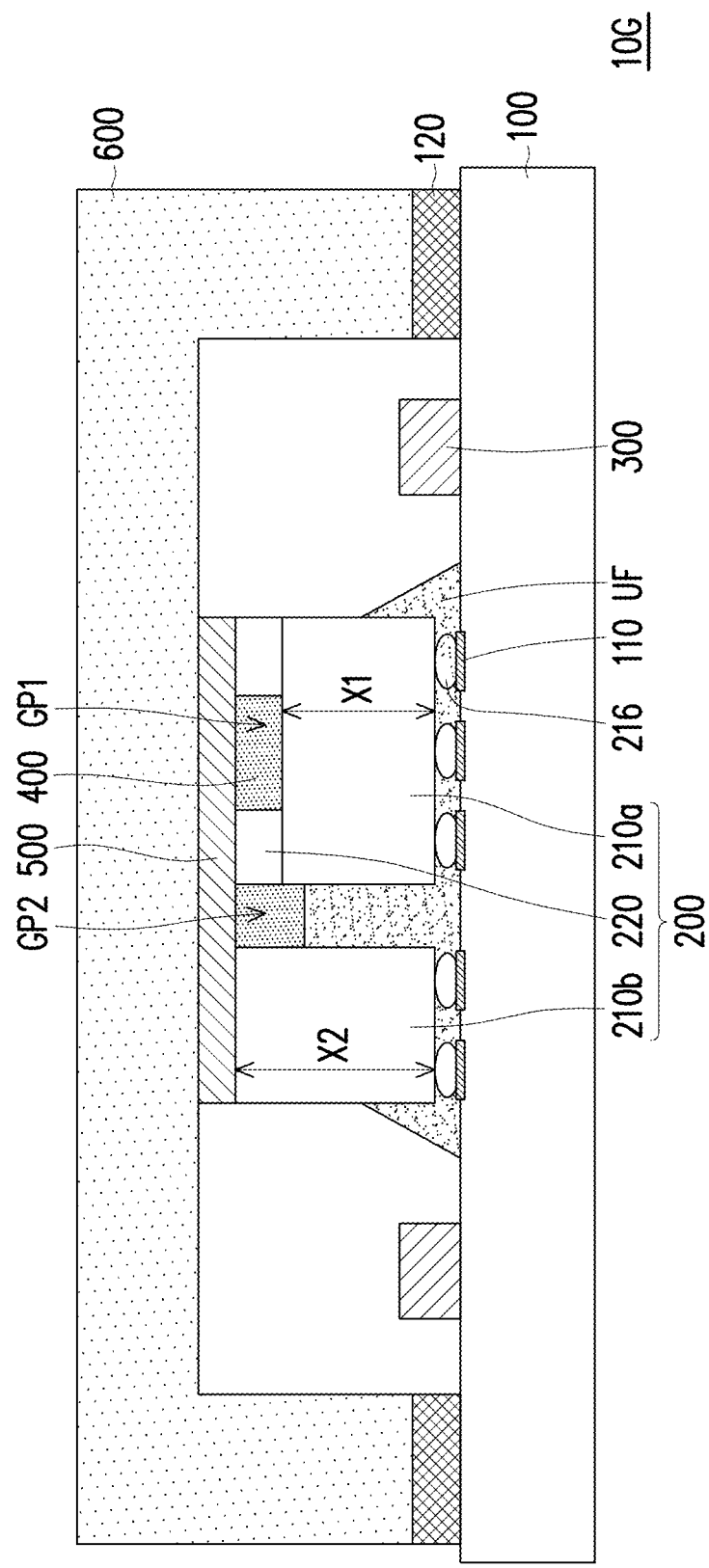
FIG. 9 schematically illustrates a cross-sectional view of a package structure in accordance with some embodiments of the disclosure.

FIG. 9 schematically illustrates a cross-sectional view of a package structure in accordance with some embodiments of the disclosure. The package structure 10G of FIG. 9 is similar to the package structure 10 of FIG. 1D, hence the same reference numerals are used to refer to the same and liked parts, and its detailed description will be omitted herein. The main difference lies in that the semiconductor package 200 of the package structure 10G includes a first integrated circuit 210a, a second integrated circuit 210b, and a plurality of components 220.

Referring to FIG. 9, the components 220 are disposed on the first integrated circuit 210a. A height X1 of the first integrated circuit 210a is smaller than a height X2 of the second integrated circuit 210b. That is, the uneven top surface of the semiconductor package 200 includes top surfaces of the components 220, a top surface of the first integrated circuit 210a, and a top surface of the second integrated circuit 210b.

A thermal conductive gel 400 is formed over the uneven top surface of the semiconductor package 200, to fill a gap GP1 between the components 220 and a gap GP2 between the first integrated circuit 210a and the second integrated circuit 210b.

In some embodiments, as shown in FIG. 9, a portion of the thermal conductive gel 400 is in contact with the underfill layer UF between the first integrated circuit 210a and the second integrated circuit 210b. However, the disclosure is not limited thereto.

A thermal conductive film 500 is formed over the components 220 and the thermal conductive gel 400. In some embodiments, the thermal conductive film 500 is in contact with the uneven top surface of the semiconductor package 200 and thermal conductive gel 400. In some embodiments, the total height of the first integrated circuit 210a and the components 220 is the same as the height X2 of the second integrated circuit 210b. The thermal conductive film 500 is in contact with the components 220 and the second integrated circuit 210b. However, the disclosure is not limited thereto. In other embodiments, the total height of the first integrated circuit 210a and the components 220 is smaller than the height X2 of the second integrated circuit 210b. That is, the thermal conductive film 500 may be in contact with the second integrated circuit 210b and separated from the components 220.

Figure 10:
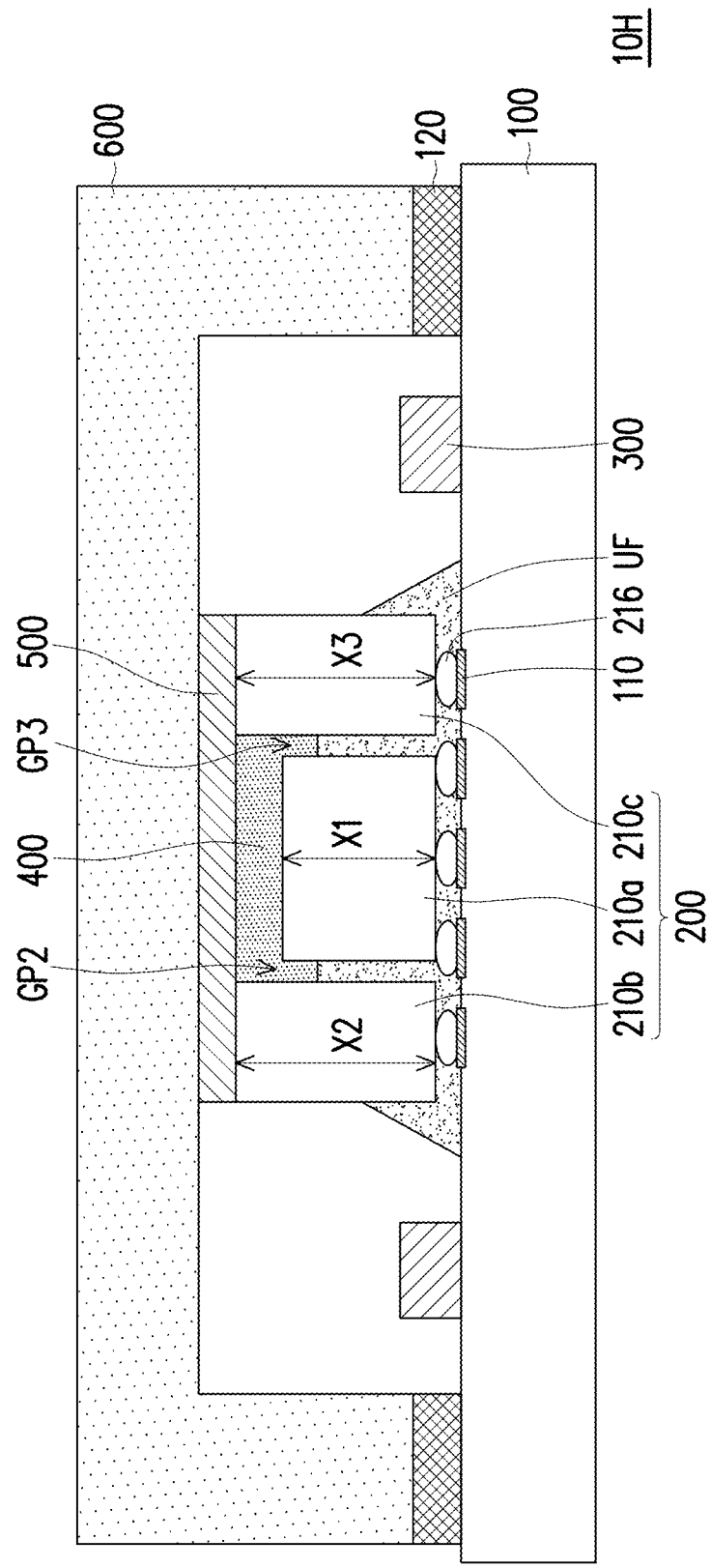
FIG. 10 schematically illustrates a cross-sectional view of a package structure in accordance with some embodiments of the disclosure.

FIG. 10 schematically illustrates a cross-sectional view of a package structure in accordance with some embodiments of the disclosure. The package structure 10H of FIG. 10 is similar to the package structure 10G of FIG. 9, hence the same reference numerals are used to refer to the same and liked parts, and its detailed description will be omitted herein. The main difference lies in that the semiconductor package 200 of the package structure 10H includes a first integrated circuit 210a, a second integrated circuit 210b, and a third integrated circuit 210c.

Referring to FIG. 10, a height X1 of the first integrated circuit 210a is smaller than a height X2 of the second integrated circuit 210b and a height X3 of the third integrated circuit 210c. That is, the uneven top surface of the semiconductor package 200 includes a top surface of the first integrated circuit 210a, a top surface of the second integrated circuit 210b, and a top surface of the third integrated circuit 210c.

A thermal conductive gel 400 is formed over the uneven top surface of the semiconductor package 200, to fill a gap GP2 between the first integrated circuit 210a and the second integrated circuit 210b and a gap GP3 between the third integrated circuit 210c and the first integrated circuit 210a and to cover the top surface of the first integrated circuit 210a.

A thermal conductive film 500 is formed over the second integrated circuit 210b, the third integrated circuit 210c, and the thermal conductive gel 400. In some embodiments, the thermal conductive film 500 is in contact with the uneven top surface of the semiconductor package 200 and thermal conductive gel 400. That is, the thermal conductive film 500 is in contact with the top surface of the second integrated circuit 210b, the top surface of the third integrated circuit 210c and the thermal conductive gel 400.

Figure 11:
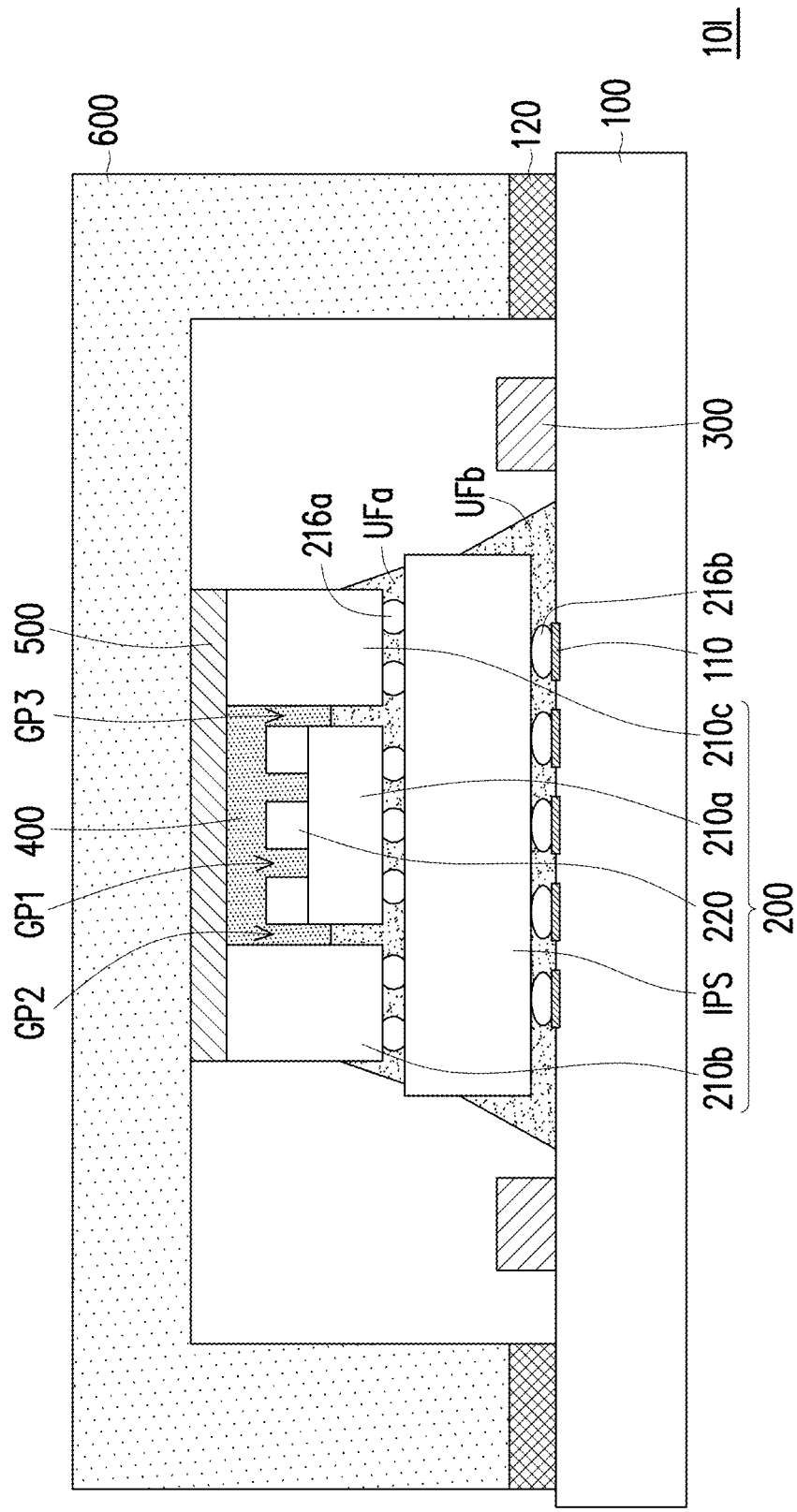
FIG. 11 schematically illustrates a cross-sectional view of a package structure in accordance with some embodiments of the disclosure.

FIG. 11 schematically illustrates a cross-sectional view of a package structure in accordance with some embodiments of the disclosure. The package structure 10I of FIG. 11 is similar to the package structure 10H of FIG. 10, hence the same reference numerals are used to refer to the same and liked parts, and its detailed description will be omitted herein. The main difference lies in that the semiconductor package 200 of the package structure 10I includes a first integrated circuit 210a, a second integrated circuit 210b, a third integrated circuit 210c, components 220, and an interposer structure IPS.

Referring to FIG. 11, the first to third integrated circuits 210a, 210b, 210c are bonded onto the interposer structure IPS through the connectors 216a. The connectors 216a may be solder balls, microbumps, or the like. The first to third integrated circuits 210a, 210b, 210c may be bonded onto the interposer structure IPS in a flip-chip manner. In some embodiments, after the first to third integrated circuits 210a, 210b, 210c are bonded to the interposer structure IPS, an underfill layer UFa is formed between the first to third integrated circuits 210a, 210b, 210c and the interposer structure IPS to protect the joints between the connectors 216a. In some alternative embodiments, the underfill layer UFa may be omitted.

The interposer structure IPS is bonded onto the substrate 100 through the connectors 216b. The connectors 216b may be solder balls, microbumps, or the like. In some embodiments, the size of the connectors 216b is greater than the size of the connectors 216a. In some embodiments, after the interposer structure IPS is bonded to the substrate 100, an underfill layer UFb is formed between the interposer structure IPS and the substrate 100 to protect the joints between the connectors 216b and the conductive pads 110. In some alternative embodiments, the underfill layer UFb may be omitted. In some embodiment, the package structure 10I includes a chip on wafer on substrate (CoWoS) package.

A thermal conductive gel 400 is formed over the uneven top surface of the semiconductor package 200, to fill a gap GP1 between the components 220, a gap GP2 between the first integrated circuit 210a and the second integrated circuit 210b, and a gap GP3 between the third integrated circuit 210c and the first integrated circuit 210a. In some embodiment, the components 220 are omitted and the thermal conductive gel 400 covers the top surface of the first integrated circuit 210a.

In some embodiments, as shown in FIG. 11, a portion of the thermal conductive gel 400 is in contact with the underfill layer UFa between the first integrated circuit 210a and the second integrated circuit 210b and between the third integrated circuit 210c and the first integrated circuit 210a. However, the disclosure is not limited thereto.

A thermal conductive film 500 is formed over the components 220 and the thermal conductive gel 400. In some embodiments, the thermal conductive film 500 is in contact with the uneven top surface of the semiconductor package 200 and thermal conductive gel 400. In some embodiments, the total height of the first integrated circuit 210a and the components 220 is smaller as the height of the second integrated circuit 210b and the height of the third integrated circuit 210c. The thermal conductive film 500 is separated from the components 220. However, the disclosure is not limited thereto. In other embodiments, the total height of the first integrated circuit 210a and the components 220 is the same the height of the second integrated circuit 210b and the height of the third integrated circuit 210c. That is, the thermal conductive film 500 may be in contact with the components 220.

In this embodiment, the package structure 10I includes a thermal conductive gel 400 covering the uneven top surface of the semiconductor package 200 and a thermal conductive film 500 over the uneven top surface of the semiconductor package 200 and the thermal conductive gel 400. However, the disclosure is not limited thereto. In other embodiment, similar to the package structure 10D of FIG. 7A, the package structure 10I includes first thermal conductive films disposed on the uneven top surface of the semiconductor package 200 and a second thermal conductive film covering the first thermal conductive films and the uneven top surface of the semiconductor package 200. In other word, in other embodiment, the package structure 10I does not have a thermal conductive gel 400.

Figure 12:
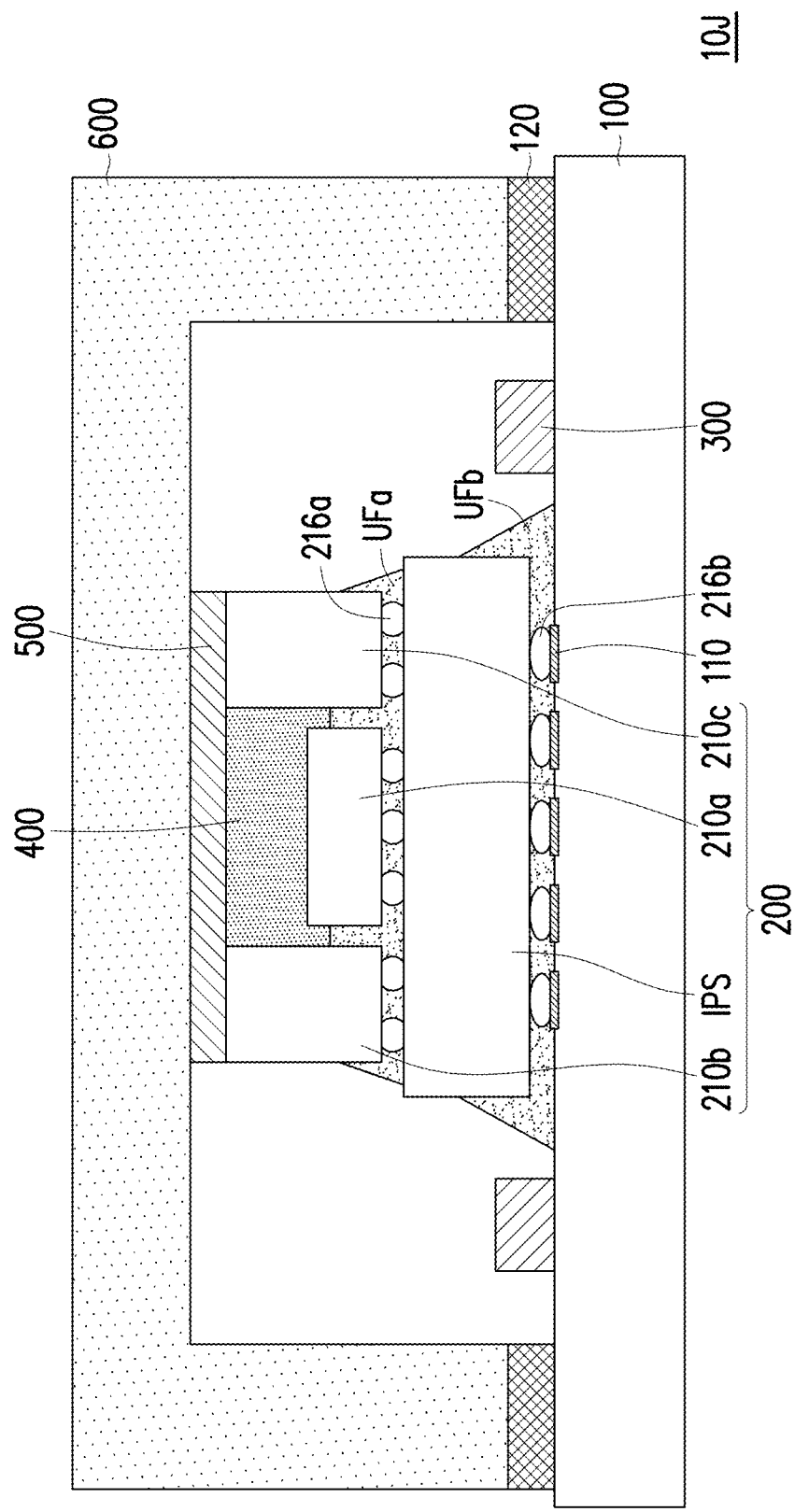
FIG. 12 schematically illustrates a cross-sectional view of a package structure in accordance with some embodiments of the disclosure.

FIG. 12 schematically illustrates a cross-sectional view of a package structure in accordance with some embodiments of the disclosure. The package structure 10J of FIG. 12 is similar to the package structure 10I of FIG. 11, hence the same reference numerals are used to refer to the same and liked parts, and its detailed description will be omitted herein. The main difference lies in that the semiconductor package 200 of the package structure 10J does not have components 220. A thermal conductive gel 400 is formed over the uneven top surface of the semiconductor package 200, to fill a gap between the second integrated circuit 210b and the third integrated circuit 210c.

In accordance with some embodiments of the disclosure, a package structure includes a substrate, a semiconductor package, a thermal conductive gel, a thermal conductive film, and a heat spreader. The semiconductor package has an uneven top surface. The thermal conductive gel covers the uneven top surface of the semiconductor package. The thermal conductive film is over the uneven top surface of the semiconductor package. A thermal conductivity of the thermal conductive film is higher than a thermal conductivity of the thermal conductive gel. The heat spreader is disposed over the thermal conductive film.

In accordance with some embodiments of the disclosure, a manufacturing method of a package structure includes at least following steps. A semiconductor package is provided, wherein the semiconductor package comprises an integrated circuit and dies on the integrated circuit, wherein gaps are formed between the dies. The semiconductor package is bonded onto a substrate. The gaps are filled with a thermal conductive gel. A thermal conductive film is formed to cover the dies and the thermal conductive gel. A heat spreader is disposed over the substrate to cover the semiconductor package, the thermal conductive gel and the thermal conductive film.

In accordance with some embodiments of the disclosure, a package structure includes a substrate, a semiconductor package, first thermal conductive films, and a second thermal conductive film. The semiconductor package is bonded onto the substrate, wherein the semiconductor package has an uneven top surface. The first thermal conductive films are disposed on the uneven top surface of the semiconductor package. The second thermal conductive film covers the uneven top surface of the semiconductor package and the first thermal conductive films.

In accordance with some embodiments of the disclosure, a package structure includes a semiconductor package, a thermal conductive gel, a thermal conductive film and a heat spreader. The thermal conductive gel is disposed over the semiconductor package. The thermal conductive film is disposed over the semiconductor package and the thermal conductive gel. A thermal conductivity of the thermal conductive film is different from a thermal conductivity of the thermal conductive gel. The thermal conductive film is surrounded by the heat spreader.

In accordance with some embodiments of the disclosure, a package structure includes a semiconductor package a first thermal conductive film and a second thermal conductive film. The first thermal conductive film is disposed over the semiconductor package. The second thermal conductive film is disposed over the semiconductor package and the first thermal conductive film. A sidewall of the second thermal conductive film is substantially flush with a sidewall of the semiconductor package.

In accordance with some embodiments of the disclosure, a package structure includes a substrate, a plurality of semiconductor device, an underfill and a first thermal conductive film. The semiconductor devices are bonded to the substrate. The underfill is disposed between the substrate and the plurality of semiconductor devices. The first thermal conductive film is inserted between the plurality of semiconductor devices. The underfill is inserted between the plurality of semiconductor devices to be in contact with the first thermal conductive film.

In accordance with some embodiments of the disclosure, a package structure includes a substrate, a first die, a second die, a first thermal conductive layer, a heat spreader and a second thermal conductive layer. The first die and the second die are bonded to the substrate. The first thermal conductive layer is inserted between the first die and the second die. The heat spreader is disposed on the substrate to cover the first die and the second die. The second thermal conductive layer is different from the first thermal conductive layer, wherein the second thermal conductive layer is disposed between the first thermal conductive layer and the heat spreader.

In accordance with some embodiments of the disclosure, a package structure includes a substrate, a first die, a second die and a first thermal conductive layer. The first die and the second die are bonded to the substrate. The first thermal conductive layer covers the first die, wherein the second die has a first surface bonded to the substrate and a second surface opposite to the first surface, and the second surface of the second die is substantially coplanar with a first surface of the first thermal conductive layer.

In accordance with some embodiments of the disclosure, a package structure includes a first die, a dam structure, a plurality of second dies and a thermal conductive gel. The dam structure is disposed on the first die. The second dies are bonded to the first die. The thermal conductive gel is disposed between the dam structure and the second dies and covering the second dies, wherein a thickness difference between the second dies and the dam structure is substantially equal to a thickness of the thermal conductive gel on the second dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
   a substrate;
   a first die and a second die, bonded to the substrate;
   a first thermal conductive layer, inserted between the first die and the second die;
   a heat spreader, disposed on the substrate to cover the first die and the second die; and
   a second thermal conductive layer different from the first thermal conductive layer, wherein the second thermal conductive layer is disposed between the first thermal conductive layer and the heat spreader, wherein the first die has a plurality of protrusions thereon, and the first thermal conductive layer is inserted between the protrusions.

2. The package structure as claimed in claim 1, wherein the first die has a first surface bonded to the substrate and a second surface opposite to the first surface, and a surface of the first thermal conductive layer is substantially coplanar with the second surface of the first die.

3. The package structure as claimed in claim 1, wherein a surface of the first thermal conductive layer is substantially coplanar with surfaces of the first die and the second die.

4. The package structure as claimed in claim 1, wherein the first die has a first surface bonded to the substrate and a second surface opposite to the first surface, and the first thermal conductive layer further extends onto the second surface of the first die.

5. The package structure as claimed in claim 1, wherein the second thermal conductive layer continuously extends over the first die, the first thermal conductive layer and the second die.

6. The package structure as claimed in claim 1 further comprising an underfill different from the first thermal conductive layer, surrounding the first die and the second die and directly under the first thermal conductive layer inserted between the first die and the second die.

7. A package structure comprising:
   a substrate;
   a first die and a second die, bonded to the substrate; and
   a first thermal conductive layer, inserted between the first die and the second die; and
   an underfill different from the first thermal conductive layer, surrounding the first die and the second die and directly under the first thermal conductive layer inserted between the first die and the second die.

8. The package structure as claimed in claim 7, wherein the second die has a first surface bonded to the substrate and a second surface opposite to the first surface, the first die has a first surface bonded to the substrate and a second surface opposite to the first surface, and the first thermal conductive layer contacts the second surface of the first die.

9. The package structure as claimed in claim 7 further comprising:
   a heat spreader disposed on the substrate to cover the first die and the second die; and
   a second thermal conductive layer disposed between the heat spreader and the first thermal conductive layer and between the heat spreader and the second die.

10. The package structure as claimed in claim 9, wherein a sidewall of the second thermal conductive layer is substantially flush with a sidewall of the second die.

11. The package structure as claimed in claim 7 further comprising a third die bonded to the substrate through a first surface of the third die, wherein a first surface of the first thermal conductive layer is further substantially coplanar with a second surface opposite to the first surface of the third die.

12. The package structure as claimed in claim 11, wherein the first thermal conductive layer is further inserted between the first die and the third die.

13. The package structure as claimed in claim 7, wherein the second die has a first surface bonded to the substrate and a second surface opposite to the first surface, and the second surface of the second die is substantially coplanar with a first surface of the first thermal conductive layer.

14. A package structure comprising:
   a first die;
   a dam structure on the first die;
   a plurality of second dies bonded to the first die; and
   a thermal conductive gel, disposed between the dam structure and the second dies and covering the second dies, wherein a thickness of the dam structure is substantially equal to a total thickness of the second dies and the thermal conductive gel on the second dies.

15. The package structure as claimed in claim 14, wherein the thermal conductive gel is inserted between the second dies.

16. The package structure as claimed in claim 14 further comprising:
   a substrate, wherein the first die is boned to the substrate;
   a heat spreader, disposed on the substrate to cover the first die and the second dies; and
   a thermal conductive layer different from the thermal conductive gel, disposed between the heat spreader and the thermal conductive gel and between the heat spreader and the dam structure.

17. The package structure as claimed in claim 16, wherein a sidewall of the thermal conductive layer is substantially flush with a sidewall of the dam structure.

18. The package structure as claimed in claim 17, wherein the sidewall of the thermal conductive layer is substantially further flush with a sidewall of the first die.

19. The package structure as claimed in claim 14, wherein the dam structure is ring-shaped.

20. The package structure as claimed in claim 16, wherein the thermal conductive layer is within a periphery region of the first die.

* * * * *